United States Patent [19]

Terasawa

[11] 3,978,513
[45] Aug. 31, 1976

[54] SEMICONDUCTOR CONTROLLED RECTIFYING DEVICE

[75] Inventor: Yoshio Terasawa, Hitachi, Japan

[73] Assignee: Hitachi, Ltd., Japan

[22] Filed: July 11, 1974

[21] Appl. No.: 487,723

Related U.S. Application Data

[63] Continuation of Ser. No. 253,886, May 16, 1972, abandoned.

[30] Foreign Application Priority Data

May 21, 1971 Japan.............................. 46-34048
Aug. 30, 1971 Japan.............................. 46-65892

[52] U.S. Cl................................... 357/38; 357/55
[51] Int. Cl.$^2$..................................... H01L 29/74
[58] Field of Search............................. 357/38, 55

[56] References Cited

UNITED STATES PATENTS

| | | | |
|---|---|---|---|
| 3,160,800 | 12/1964 | Smart.................................. | 357/38 |
| 3,476,989 | 11/1969 | Miles et al. ........................ | 357/38 |
| 3,566,211 | 2/1971 | Svedberg .............................. | 357/38 |
| 3,622,845 | 11/1971 | McIntyre et al. ..................... | 357/38 |
| 3,725,753 | 4/1973 | Garrett ................................ | 357/38 |
| 3,731,162 | 5/1973 | Svenaga et al........................ | 357/38 |

*Primary Examiner*—William L. Sikes
*Assistant Examiner*—Joseph E. Clawson, Jr.
*Attorney, Agent, or Firm*—Craig & Antonelli

[57] ABSTRACT

A semiconductor controlled rectifying device comprising a substrate having a four-layer structure wherein first and second regions are formed in one of the outermost layers of the structure and wherein a gate electrode is provided between the first and second regions.

11 Claims, 21 Drawing Figures

SEMICONDUCTOR CONTROLLED RECTIFYING DEVICE

This is a continuation, of application Ser. No. 253,386 filed May 16, 1972, now abandoned.

In general, a semiconductor controlled rectifying device which turns on by the signal applied to the gate electrode comprises a semiconductor substrate having a four-layer structure consisting of two P-type layers and two N-type layers alternately joined together, two main electrodes so disposed on the outermost P- and N-type layers as to be kept in low resistance contact with the outermost layers and a gate electrode connected with one of the inner P- and N-type layers.

If in such a semiconductor controlled rectifying device a pulse voltage to cause the gate current to flow is applied between the gate electrode and one of the main electrodes nearer the gate electrode while a forward voltage is applied between the main electrodes, then current begins to flow between the main electrodes of the device which, without the application of the gate voltage, would remain non-conductive. The phenomenon that the non-conductive semiconductor controlled rectifying device is driven conductive, is called turn-on.

In such a semiconductor controlled rectifying device as mentioned above, a small area near the gate electrode is first turned on upon the application of the gate voltage and the initial conduction area gradually spreads over the whole area with time.

Therefore, if the rate of increase in load current (the inrush current slope) di/dt in the initial period of turn-on process is excessively large, a load current is concentrated in the limited area in the vicinity of the gate electrode so that the temperature at that area rises until the device has been damaged. Hence, it is necessary to prevent the thermal destruction by rendering the device a sufficient tolerance against the inrush current slope di/dt.

For example, a device has been proposed which has a gate electrode in the shape of a ring and in which the initial conduction takes place in a large area. However, such a device has a drawback in that gate current sufficient to turn-on the device is of a very large value.

The most preferable condition to be satisfied by a semiconductor controlled rectifying device is that a larger area can be turned on by a smaller gate power. This requirement is especially essential for the device used in a high frequency circuit. In high frequency design, it is necessary to make the turn-off time of the device short, and the carrier lifetime is also shortened so that the spreading of the turn-on region takes place more slowly. Consequently, load current having a high rate of current increase di/dt will flow locally through the P-N-P-N junction so that local temperature rise is caused in the P-N-P-N junction resulting in an increase in turn-off time, and the deterioration in the tolerance to the rate of rise in forward voltage or the thermal damage of the device.

Accordingly, it is an object of the present invention to provide a semiconductor controlled rectifying device having a novel constitution. Another object of the present invention is to provide a semiconductor controlled rectifying device having a high tolerance to the inrush current slope di/dt. An additional object of the present invention is to provide a semiconductor controlled rectifying device which can be turned on with a smaller gate current. A further object of the present invention is to provide a semiconductor controlled rectifying device in which a larger area can be turned on by a smaller gate current. Yet another object of the present invention is to provide a semiconductor controlled rectifying device having a large current capacity. Further objects and advantages of the present invention will become apparent as the following description proceeds, and the features of novelty characterizing the invention will be pointed out particularly in the claims annexed to and forming a part of this specification.

For better understanding of the present invention, reference should be made to the attached drawings, in which.

Figure 3:
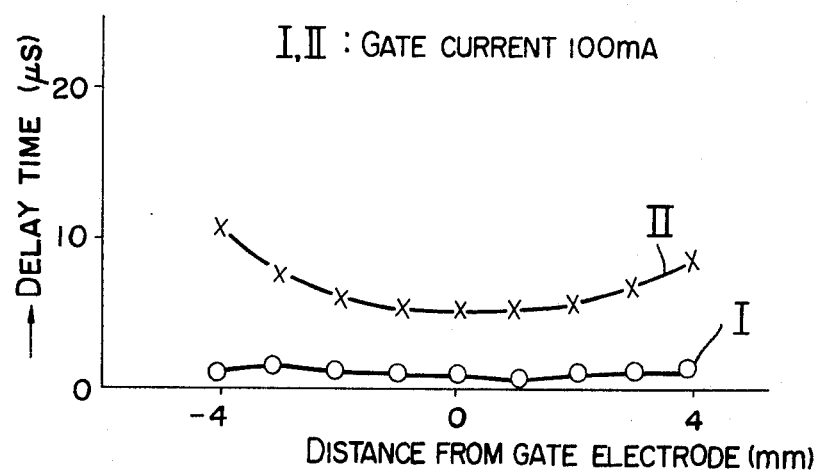
Figure 4:
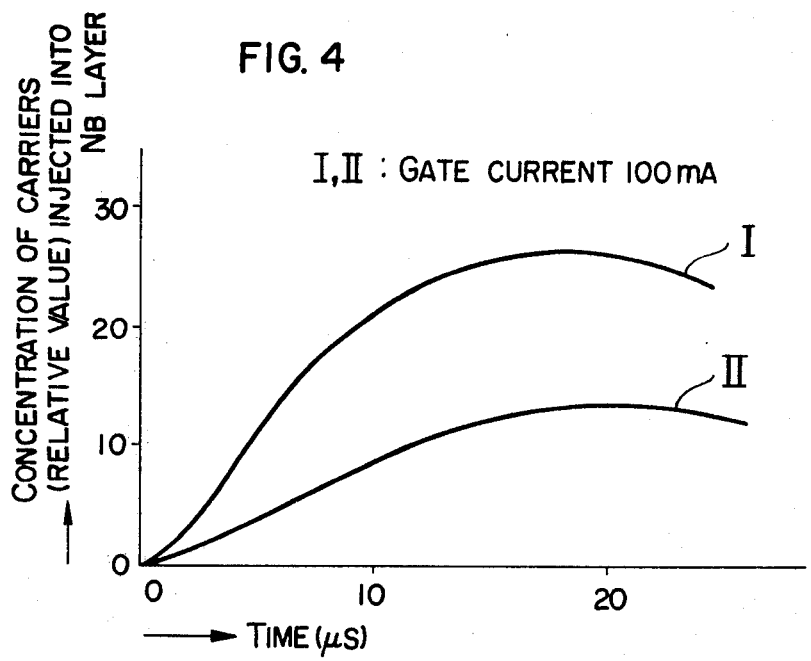
Figure 5:
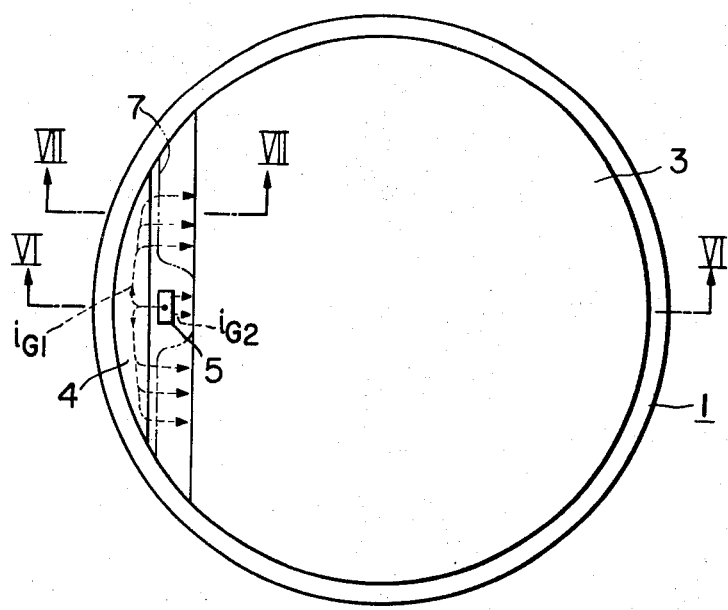
Figure 6:
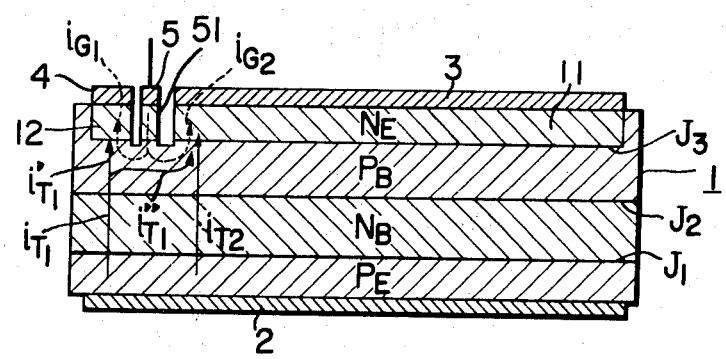
Figure 7:
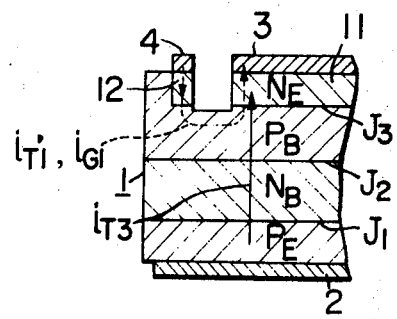
Figure 8:
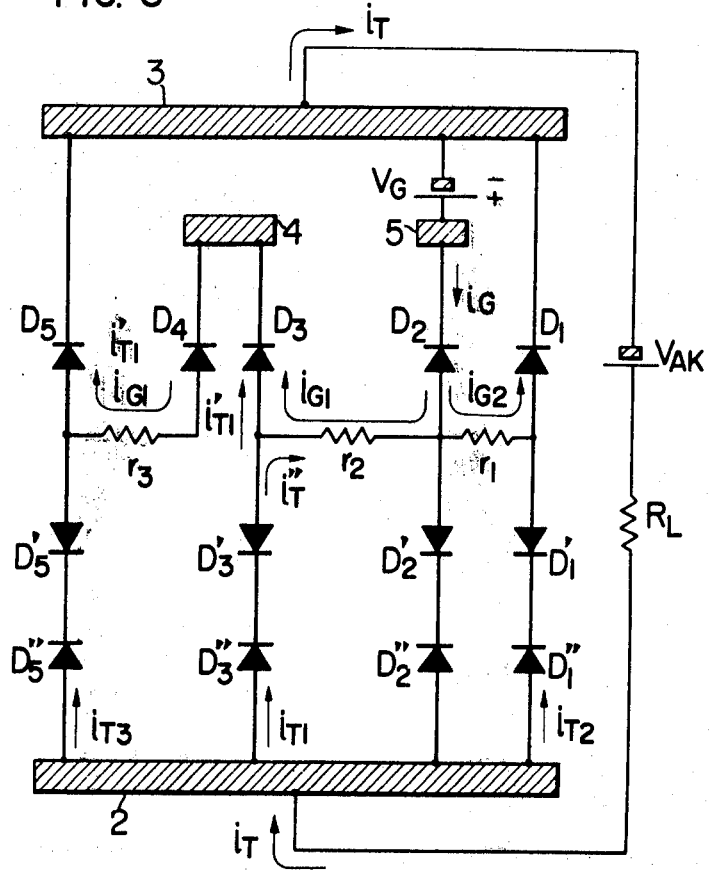
Figure 9:
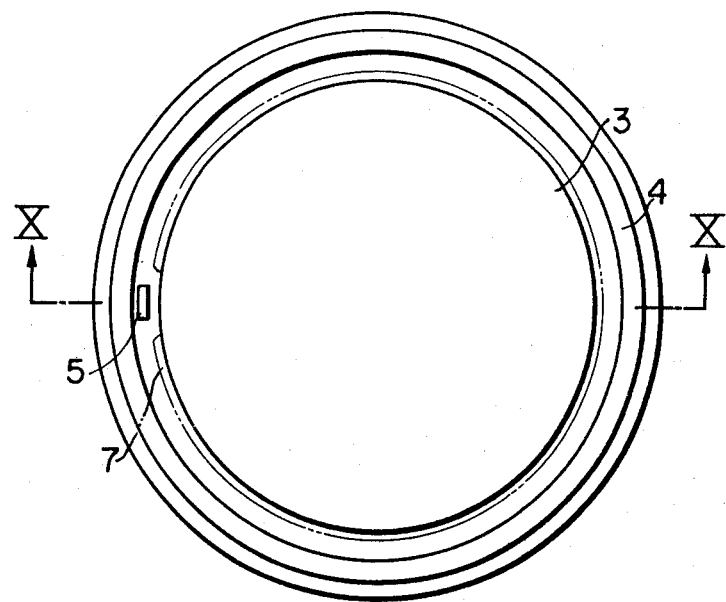
Figure 10:
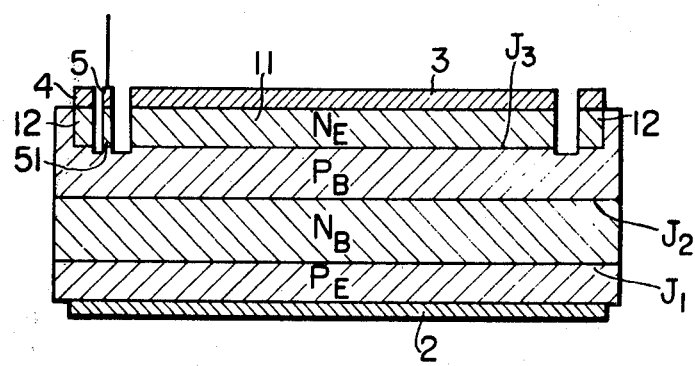
Figure 11:
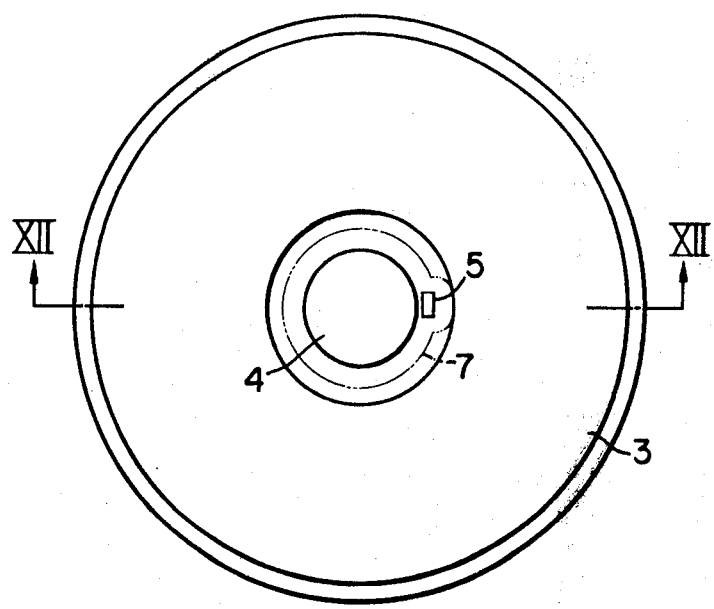
Figure 12:
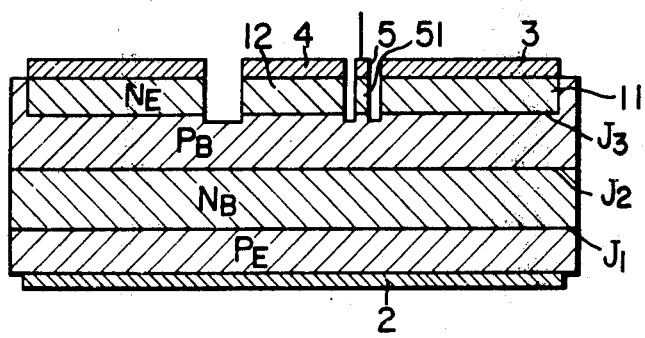
Figure 13:
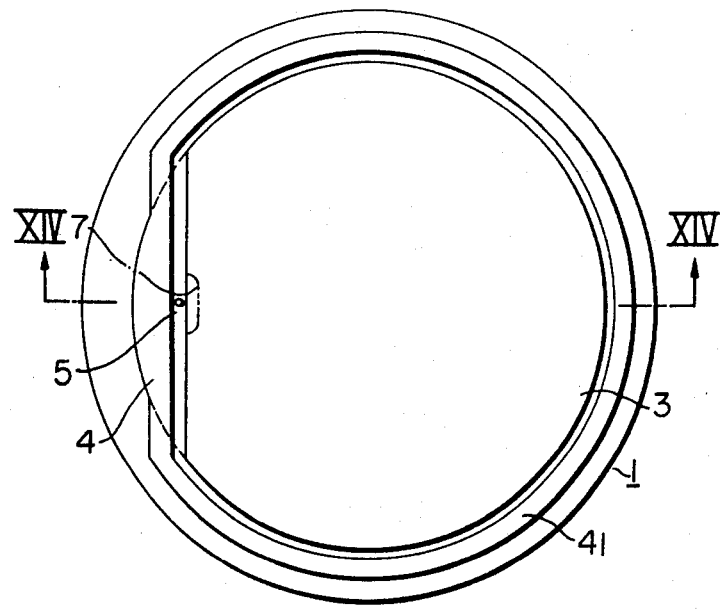
Figure 14:
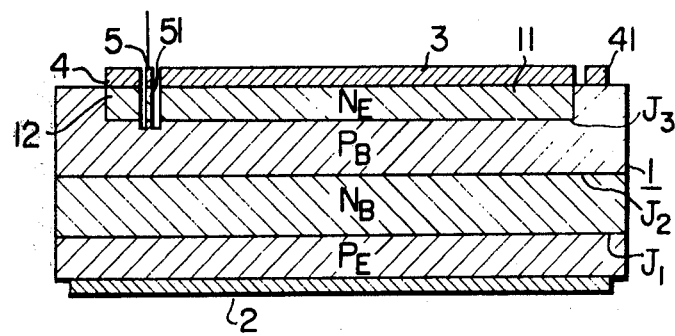
Figure 15:
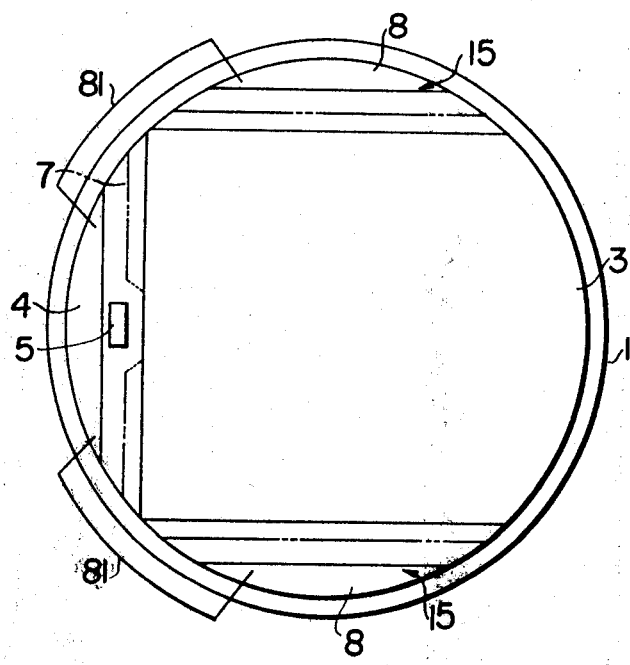
Figure 16:
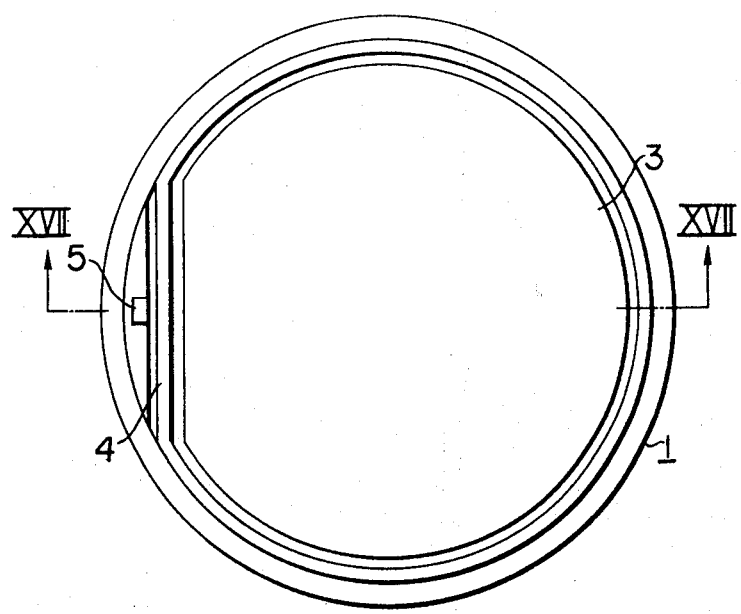
Figure 17:
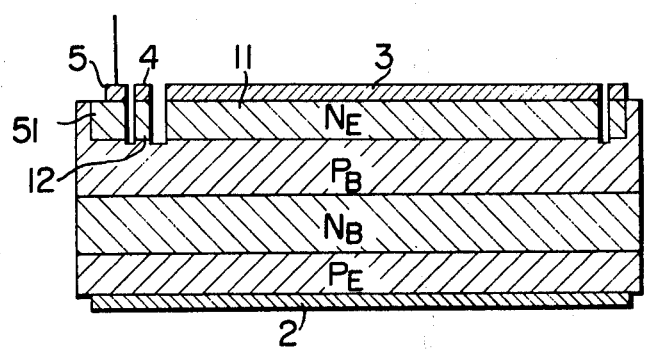
Figure 18:
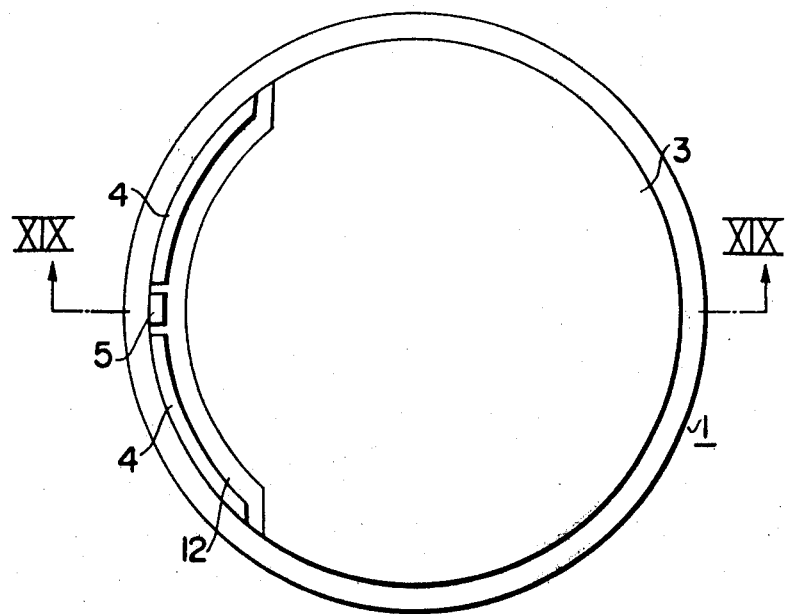
Figure 19:
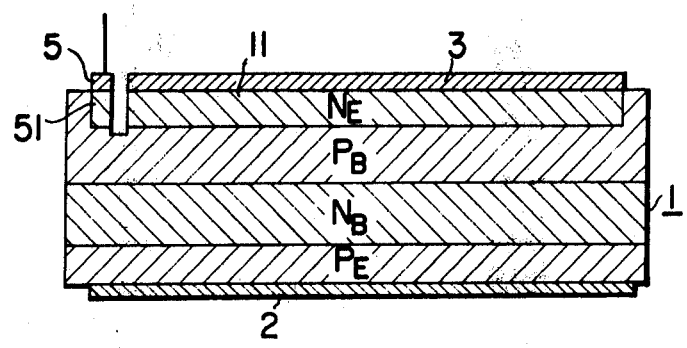
Figure 20:
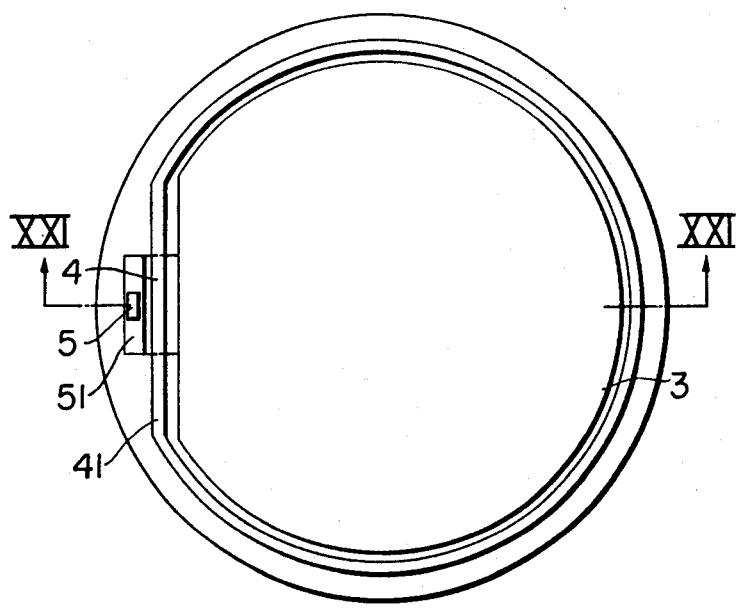

FIG. 3 graphically shows the turn-on delay-time characteristics of both the device according to the present invention and the conventional device for the purposes of comparison;

FIG. 4 shows characteristic curves representing time change of the concentration of carriers injected into the N-base layer by the application of gate voltage;

FIG. 5 is a plan view of another example embodying the present invention;

FIGS. 6 and 7 are cross sections taken along lines VI — VI and VII — VII in FIG. 5;

FIG. 8 is an electrical equivalent circuit of the device shown in FIG. 5;

FIG. 9 is a plan view of a third embodiment of the invention;

FIG. 10 is a cross section taken along line X — X in FIG. 9;

FIG. 11 is a plan view of a fourth embodiment of the invention;

FIG. 12 is a cross section taken along line XII — XII in FIG. 11;

FIG. 13 is a plan view of a fifth embodiment of the invention;

FIG. 14 is a cross section taken along line XIV — XIV in FIG. 13;

FIG. 15 is a plan view of a sixth embodiment of the invention;

FIG. 16 is a plan view of a seventh embodiment of the invention;

FIG. 17 is a cross section taken along line XVII — XVII in FIG. 16;

FIG. 18 is a plan view of a eighth embodiment of the invention;

FIG. 19 is a cross section taken along line XIX — XIX in FIG. 18;

FIG. 20 is a plan view of a ninth embodiment of the invention; and

Figure 21:
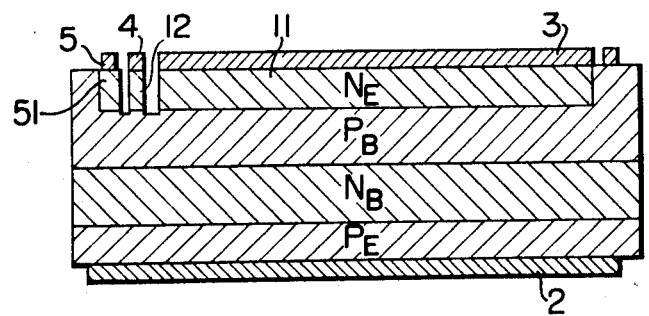

FIG. 21 is a cross section taken along line XXI — XXI in FIG. 20.

Figure 1:
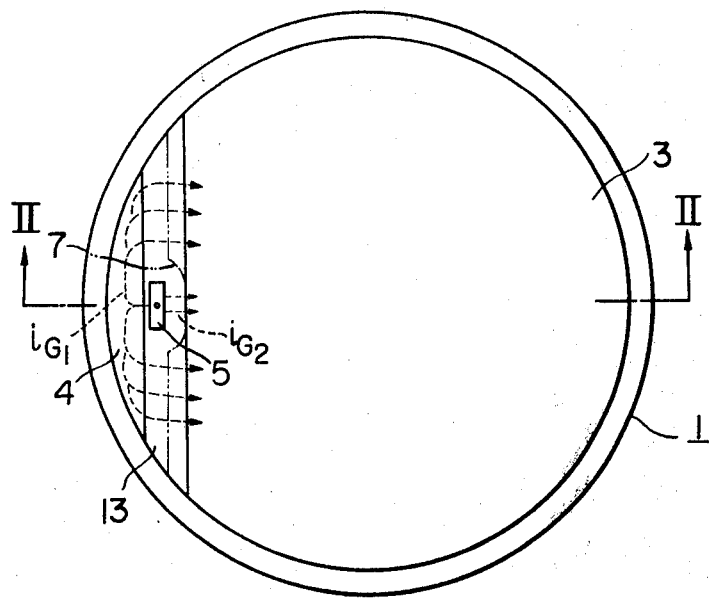
FIG. 1 is a plan view of a semiconductor controlled rectifying device according to the invention.
Figure 2:
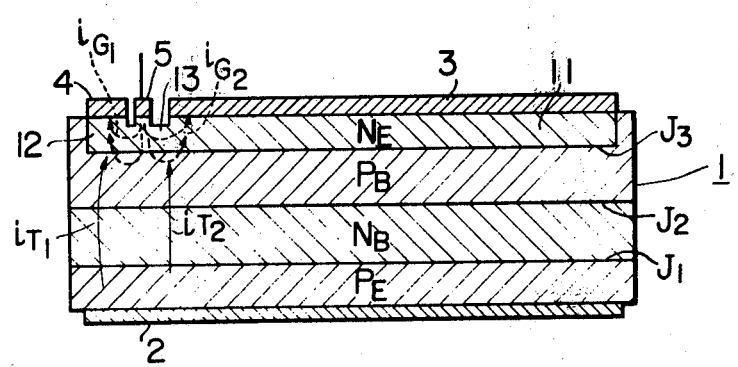
FIG. 2 is a cross section taken along line II — II in FIG. 1.

Now, reference should be made to FIG. 1, FIG. 2 and FIG. 3. A semiconductor substrate 1 has a four-layer constitution comprising a P-emitter layer, an N-base layer, a P-base layer and an N-emitter layer; the N-base layer $N_B$ having N-type conductivity, the P-emitter and the P-base layers $P_E$ and $P_B$ having P-type conductivity and formed on both the sides of the N-base layer $N_B$ in such a manner that these layers $P_E$ and $P_B$ together with the N-base layer $N_B$ may constitute a first and a second P-N junctions $J_1$ and $J_2$, and the N-emitter layer having N-type conductivity and embedded in the P-base layer $P_B$ so as to form a third P-N junction $J_3$ together with the P-base layer $P_B$, with one surface thereof exposed.

The N-emitter layer $N_E$ is constituted of a first region 11 having a large area, a second region 12 disposed apart by a constant distance from the first region and a third region 13 disposed between the first and the second regions and having a thickness less than those of the first and the second regions. The third region 13 has such a controlled width and thickness that electrical resistance may be almost uniform everywhere between the first region 11 and the second region 12.

A main electrode 2 as an anode is in ohmic contact with the P-emitter layer $P_E$, while a main electrode 3 as a cathode is in ohmic contact with the first region 11 in the N-emitter layer $N_E$, a conductive layer 4 being in contact with the surface of the second region 12 in the N-emitter layer $N_E$ and a gate electrode 5 being in contact with the surface of the third region 13 in the N-emitter layer $N_E$. The gate electrode 5 is so arranged that the portion of the second region 12 opposite to the gate electrode 5 may be turned on by the gate current $i_{G1}$ flowing from the gate electrode 5 into a part of the first region 11 apart from the gate electrode through the second region 12 when a voltage which renders the gate electrode more positive than the main cathode electrode 3 is applied at least between the gate electrode 5 and the main electrode 3 in the third region 13. Namely, when a gate voltage is applied between the gate electrode 5 and the main electrode 3, the current flowing from the gate electrode 5 to the main cathode electrode 3 is split into two components $i_{G1}$ and $i_{G2}$; one $i_{G2}$ flowing from the gate electrode 5 directly into the cathode electrode 3 and the other $i_{G1}$ flowing from the gate 5 into the cathode 3 through the second region 12. Therefore, the gate electrode 5 is disposed on the third region 13 in such a manner that the ratio of the impedance between the gate 5 and the cathode 3 to the sum of both the impedance between the gate 5 and the second region 12 and the impedance between the second region 12 and the cathode 3 may be large enough for the current component $i_{G1}$ flowing from the gate 5 through the second region 12 into the cathode 3 to turn-on the portion of the second region 12 opposite to the gate 5. For example, in case where the impedance between the second region 12 and the cathode 3 is much smaller than that between the gate 5 and the second region 12, say, equal to 1/10, it is only necessary to take into account both the impedance between the gate 5 and the cathode 3 and the impedance between the gate 5 and the second region 12 so as to turn-on the second region 12. The location of the gate electrode 5 depends upon the quantity of the gate current in use, but for small current constitution it is preferable to dispose the gate electrode 5 slightly nearer to the second region 12 than to the cathode electrode 3.

Now, the mechanism of turn-on of the semiconductor controlled rectifying device having such a constitution as described above will be described.

First, a voltage is applied between the anode electrode 2 and the cathode electrode 3 such that the anode 2 is more positive than the cathode 3. As a result, the first and the third P-N junctions $J_1$ and $J_3$ are forward biased and the second P-N junction $J_2$ is reverse-biased to form a depletion layer in the vicinity of the junction $J_2$ so that the voltage applied between the anode and the cathode is blocked. Under this condition, a gate voltage which renders the gate electrode 5 more positive than the cathode electrode 3 is applied between the gate and the cathode. Due to this voltage, there arise two kinds of current components, i.e. a current component $I_1$ (designated by broken-lined arrow in FIG. 2) flowing from the gate electrode 5 through the third region 13 of the N-emitter layer $N_E$ concentratedly into the part of the second region 12 opposite to the gate electrode 5 and a current component $I_2$ (designated also by broken-lined arrow in FIG. 2) flowing from the gate electrode 5 through the third region 13 of the N-emitter layer $N_E$ into the cathode electrode 3. The third region 13 has a reduced thickness so as to make the lateral impedance large so that most of the current component $I_1$ or $I_2$ is to be bypassed through the adjacent P-base layer $P_B$. The injection of electrons takes place from the third P-N junction $J_3$ into the P-base layer when the by-passed current crosses the P-N junction $J_3$ from the P-base layer $P_B$ to the N-emitter layer $N_E$. When electrons are injected into the P-base layer $P_B$, the electrons approach the depletion layer, penetrate the depletion layer and move toward the N-base layer $N_B$. This movement of electrons causes holes to be injected from the P-emitter layer $P_E$ through the N-base layer $N_B$ into the P-base layer $P_B$ so that the depletion layer becomes narrower in portions nearest the gate electrode 5 in the second region 12 and the first region 11. The collapse of the depletion layer results in the initial load currents $i_{T1}$ and $i_{T2}$ (designated by solid lined arrow) flowing from the anode electrode 2 to the second region 12 and to the portion of the first region 11 near the gate electrode 5 to turn-on the second region 12 and a part of the first region 11.

The current $i_{T1}$ flowing into the second region 12 spreads over the conductive layer 4 on the second region 12 and flows into the first region 11 through the third region 13. This current $i_{T1}$ results in the electron injection from the part of the third P-N junction $J_3$ on the edge of the first region 11 near the second region 12 into the P-base layer $P_B$. Simultaneous with the electron injection, the boundary portion of the first region 11 near the second region 12 turns on.

As has been described above, according to the semiconductor controlled rectifying device having such a structure as described above, the first region 11 and a part of the second region 12 initially turn on, and therefore the present device has a larger initial turn-on area than the conventional device which is similar to the device shown in FIG. 1 but has a gate electrode attached to the surface of the P-base layer $P_B$ at the outer exposed end of the second region. Moreover, since the boundary portion of the first region 11 opposite to the second region 12 can be turned on by the load current $i_{T1}$ flowing due to turn-on of the second region 12, thee secondary turn-on area is made large. Consequently, the tolerance to the inrush current slope di/dt and the velocity of the spreading of the conducting region are increased. These increases in the tolerance and the velocity make it possible to provide a high power, high frequency semiconductor controlled rectifying device.

In order to improve such an effect as described above, it is preferable that the first and second regions near the gate electrode 5 should be almost simultaneously turned on or that the second region 12 should be turned on prior to the first region. This is because the tolerance to the inrush current slope di/dt with respect to the device under consideration can be increased by increasing both the tolerance to the inrush current slope di/dt during the initial turn-on process and that during the secondary turn-on process and because the limit to the inrush current slope di/dt during the initial turn-on process can be increased by rendering the first and second regions 11 and 12 near the gate electrode 5 turned on due to the gate current while that during the secondary turn-on process can be increased if the first region 11 opposite to the second region 12 is turned on by the load current flowing due to the turning-on of the second region 12. It is, therefore, necessary that the density of the current flowing into the second region 12 should be nearly the same as the density of the current flowing into the first region 11 or that the former should be larger than the latter. In practice, it is only necessary that the sum of both the impedance between the gate electrode 5 and the second region 12 and the impedance between the second region 12 and the first region 11 should be equal to or smaller than the impedance between the gate electrode 5 and the first region 11 and that the lengths of the edges of the first and second regions 11 and 12 opposite to each other should be greater than the length of the gate electrode 5 along the edges of the first and second regions 11 and 12. Thus, most of the gate current flows through the second region 12 into the first region 11 and, moreover, since the density of the gate current flowing from the gate electrode 5 into the second region 12 can be made greater than that of the gate current flowing from the gate electrode 5 or the second region 12 into the first region 11, the portion of the second region 12 opposite to the gate electrode 5 can be turned on earlier than the other portion. Further, with this constitution, there is obtained a merit that the turn-on delay time, i.e., period from the time the gate current begins to flow to the time the device turns on, is reduced. This is explained by reference to FIGS. 3 and 4.

FIG. 3 is a graphical representation of turn-on delay times with respect to the semiconductor controlled rectifying device according to the present invention, shown in FIG. 1 and the conventional device which is similar to that shown in FIG. 1 but has in addition a gate electrode attached onto the surface of the P-base layer $P_B$ in the neighborhood of the external end of the second region 12 of the device as shown in FIG. 1. These characteristic curves have been obtained through measurement by the microwave technique the present inventor has developed.

In FIG. 3, the abscissa represents the distance from the gate electrode 5 along the boundary between the first region 11 and the third region 13 while the ordinate gives the turn-on delay time. Curves I and II correspond to the characteristics of the device according to the present invention and of the conventional device, respectively. It is, therefore, manifest from the inspection of these curves that the turn-on of the device according to the invention takes place within rather a large area.

FIG. 4 shows time changes of the concentration of carriers injected into the N-base layer near the gate when the gate current of a 100 mA, square-wave pulse with a duration of 18 $\mu$secs was applied. These characteristic curves I and II have been plotted as a result of measurement by the microwave technique. These curves I and II in FIG. 4 also correspond to the device according to the invention and the conventional device, respectively. It is clear from FIG. 4 that the concentration of injected carriers in the present device are nearly twice greater than those in the conventional device.

In order for the semiconductor controlled rectifying device to be turned on, the concentration of the carriers injected into the N-base layer $N_B$ due to the gate current has to reach a certain threshold value. Therefore, in order to shorten the turn-on delay time, the increasing rate of concentration of the carriers injected into the N-base layer $N_B$ when the gate current is applied must be great. It follows from this that the device according to the invention, shown in FIGS. 1 and 2 can be turned on sooner than the conventional device since the concentration of carriers injected due to the gate current in the present device is greater than that in the conventional device, as seen in FIGS. 3 and 4. If the turn-on delay time is kept the same as that of the conventional device, the gate current in the present device can be accordingly reduced.

In order for a larger area of the first region 11 in the device shown in FIGS. 1 and 2 to be turned on, it is necessary to make uniform the resistance of the third region 13 everywhere in the direction along its width between the first and second regions 11 and 12 at least except in the vicinity of the gate electrode 5. If there is a portion in the third region 13 where the resistance is lower or higher, the portion will be turned on sooner or later, correspondingly, than the remaining part of the third region 13. Thus, the initial turn-on area may be disadvantageously reduced. For example, if there is a portion where the resistance is lower, the part of the first region 11 corresponding to the portion having lower resistance is first turned on so that the load current is concentrated in that part to give rise to a danger of over-heating damage due to the current concentration. With the constitution as described above, the object of the present invention can be attained without reducing the area for conduction of load current. The device shown in FIGS. 1 and 2 has the opposing borders of the first and second regions 11 and 12 arranged parallel throughout. However, in order to make the conduction area of the device as large as possible, it is necessary to decrease the interval between the first and second regions 11 and 12 with a recess cut in the first region 11 near the gate electrode 5, as designated by an alternate long and two short dash line 7 in FIG. 1.

The semiconductor controlled rectifying device shown in FIGS. 1 and 2 has an N-emitter layer $N_E$ comprising a first region 11, a second region 12 and a third region 13 on which a gate electrode 5 is provided. However, even if the third region 13 of the device shown in FIGS. 1 and 2 is removed, the device devoid of the third region 13 can still attain the object of the present invention. Such a modified device is shown in FIGS. 5, 6 and 7 and explained by reference to FIGS. 5, 6 and 7. The modified device is different from the device shown in FIGS. 1 and 2 in that an N-emitter layer $N_E$ consists of a first region 11 having a large area and a second region 12 isolated from the first region 11 by an adjacent layer, i.e. a P-base layer $P_B$ and that a gate electrode 5 is provided on the surface of the P-base layer $P_B$ between the first and second regions 11 and 12. The gate electrode 5 is so arranged in position that the boundary portion of the second region 12 near the gate electrode 5 is turned on simultaneous with or sooner than the boundary portion of the first region 11 near the gate electrode 5. As seen in FIG. 5, the gate electrode 5 is connected with the P-base layer $P_B$ by way of an N layer 51 having a small area, which serves to improve the tolerable limit to the inrush current slope di/dt and the stability of firing operation. These functions of the layer 51 will be described in further detail below. The same reference numerals and characters have been applied to like parts or constituents as in FIGS. 1 and 2.

FIG. 8 shows an equivalent electrical circuit of the device as shown in FIGS. 5, 6 and 7. Diodes $D_1$-$D_5$ correspond to the diode formed by the N-emitter layer $N_E$ and the P-base layer $P_B$. Resistors $r_1$, $r_2$ and $r_3$ correspond to the resistances in the lateral direction of the P-base layer between the first region 11 and the gate electrode 5, between the gate electrode 5 and the second region 12 and between the second region 12 and the first region 11, respectively; $r_1$, $r_2$ and $r_3$ being determined by the thickness, width and length of the P-base layer $P_B$. Diodes $D_1'$-$D_5'$ correspond to the diode formed by the P-base layer $P_B$ and the N-base layer $N_B$, in which a depletion layer is formed when a forward voltage is applied between the anode and cathode electrodes of the device to prevent the forward conduction of the device. Diodes $D_1''$-$D_5''$ correspond to the diode formed by the P-emitter layer $P_E$ and the N-base layer $N_B$. The P-N junction between the N-emitter layer $N_E$ and P-base layer $P_B$, i.e. diodes $D_1$-$D_5$ in FIG. 8, through which the gate current flows in the forward direction, is forward-biased due to the application of the gate voltage, so that electrons are injected from the N-emitter layer $N_E$ into the P-base layer $P_B$ in proportion to the gate current flowing across the P-N junction $J_3$ in the forward direction. The injected electrons pass through the depletion layer of the second P-N junction $J_2$ and move toward the N-base layer $N_B$. Due to this injection of the electrons, holes are injected from the P-emitter layer $P_E$ through the N-base layer $N_B$ into the P-base layer $P_B$. As a result of the electron and hole injections, the resistance of the highresistive depletion layer formed in the second P-N junction $J_2$ (represented by the diodes $D_1'$, $D_3'$ and $D_5'$ in FIG. 8) due to the application of a forward voltage, is rendered low. Then, load currents $i_{T1}$, $i_{T2}$ and $i_{T3}$ flow through the P-N junction $J_2$ (diodes $D_1'$, $D_3'$ and $D_5'$) having the thus lowered resistance so that a part of the device 1 can be turned on (i.e. initial turn-on takes place). The order of the load currents $i_{T1}$, $i_{T2}$ and $i_{T3}$ starting to flow corresponds to the order of magnitudes of the densities of the gate currents $i_G$'s flowing forward through the diodes $D_1$, $D_3$ and $D_5$. Therefore, if the diode $D_3$ is so chosen that the density of current flowing therethrough may be large in case of a gate current being small, then the load current $i_{T1}$ can be made to flow by the small gate current $i_G$. The current $i_{T1}$ flows into the cathode electrode 3 via two paths, as seen in FIG. 8. Since, as described above, load current $i_{T1}'$ through the diode $D_5$ has the same function as the gate current $i_{G1}$, the thickness of the depletion layer in the diode $D_5'$ is reduced so that load current $i_{T3}$ can begin to flow. If, in this case, it is desired to allow a large load current $i_T$ to flow in response to the small gate current $i_G$, it is necessary to increase the lengths of the border lines of the conductive layer 4 and the cathode electrode 3 opposite to each other. By doing this, load current $i_{T3}$ can begins to flow near the long periphery of the cathode electrode 3 opposite to the conductive layer 4, i.e. a larger secondary turn-on area can be obtained. Further, if a gate voltage having a steep rising slope is applied to the diode $D_2$ having a high avalanche breakdown voltage, the displacement current due to the junction capacitance of the diode $D_2$ is increased so that the rate of rise in the gate current $i_{G1}$ flowing into the second region 12 is to be considerably increased. Consequently, it is possible to cause the load current $i_{T1}$ to start earlier. Therefore, the nonuniformity of turn-on delay time caused in case where a plurality of devices, such as the device 1 are connected in series or parallel, can be reduced and there is obtained a remarkable effect of improving the stability of firing operation in minimizing the nonuniformity of the load current and the voltage applied between the anode electrode and the cathode electrode at the early stage of turn-on process. As the device 1 can be turned on earlier due to the displacement current in the diode $D_2$, so the part of the first region 11 opposite to the conductive layer 4 can be turned on earlier. Namely, if the amplitude of the voltage applied between the conductive layer 4 and the cathode electrode 3 is large, which voltage begins to rise with the initiation of the flowing of the load current $i_{T1}$, then the displacement current due to the junction capacitance of the diode $D_4$ is increased. The displacement current flows from the second region 12 through the resistor $r_3$ into the diode $D_5$ so that the part of the first region 11 opposite to the conductive layer 4 is turned on earlier. As a result of this, the temperature rise due to Joule heat created in the part of the P-N-P-N junction where the load current $i_{T1}$ flows initially can be suppressed and the tolerance to the inrush current slope di/dt can also be elevated. According to the device shown in FIGS. 5, 6 and 7, a larger initial turn-on area and a larger secondary turn-on area can be obtained with smaller gate current than is required in the device shown in FIGS. 1 and 2 and therefore the tolerance to the inrush current slope di/dt can be improved. Moreover, the following effects can be expected.

The first effect is that since there is no N-emitter layer $N_E$ between the gate electrode 5 and the second region 12 and between the gate electrode 5 and the first region 11, the gate current to cause the load currents $i_{T1}$, $i_{T2}$ and $i_{T3}$ to flow can be further decreased. One reason for this is as follows. Namely, as seen in FIG. 8, the N-emitter layer $N_E$ serves as the by-pass resistor connecting the cathode of the diode $D_1$ with that of the diode $D_2$ and the by-pass resistor connecting the cathode of the diode $D_2$ with that of the diode $D_3$. Therefore, a part of the gate current is by-passed through this N-emitter layer $N_E$ so that the currents through the diodes $D_1$ and $D_3$ are decreased. Consequently, the value of the total gate current $i_G$ at which the load currents $i_{T1}$ and $i_{T2}$ are caused to flow, is lowered. Another reason is the following. As seen in FIGS. 5, 6 and 7, in case where there is no N-emitter layer $N_E$ in the vicinity of the gate electrode 5, the gate current $i_{G1}$ flows through the bottom portion of the N-emitter layer $N_E$. Accordingly, the injection of electrons from the N-emitter layer $N_E$ into the P-base layer $P_B$ takes place through the P-N junction nearest the N-base layer $N_B$ so that the number of electrons which reach the N-base layer $N_B$ is increased; the number of electrons falls off exponentially with increasing distance between the third P-N junction $J_3$ and the N-base layer $N_B$. In the conventional device in which a gate electrode is provided on the surface of the P-base layer near the surface of the N-emitter layer near the periphery of the cathode electrode, i.e. device wherein a gate electrode is provided on the surface of the P-base layer $P_B$ at the upper right portion of the device as shown in FIG. 2, the resistance of the P-base layer $P_B$ increases in proportion to the distance from the gate electrode toward the N-base layer $N_B$. It is, therefore, through the part of the P-N junction $J_3$ nearest the N-base layer $N_B$ that the gate current flowing from the P-base layer $P_B$ into the N-emitter layer $N_E$ across the junction $J_3$ becomes smallest. Consequently, with the device shown in FIGS. 5, 6 and 7 wherein all the gate current flows into the N-emitter layer $N_E$ across the part of the junction $J_3$ nearest the N-base layer, the gate current sufficient to render the device turned on can be decreased. The same is true for the case where there is no N-emitter layer $N_E$ between the second region 12 and the first region 11. Namely, if there is N-emitter layer $N_E$ between the second and first regions 12 and 11, a part of load current $i_{T1}'$ is by-passed through the layer $N_E$ (in terms of the equivalent circuit in FIG. 8 the by-pass resistor connected between the cathodes of the diodes $D_4$ and $D_5$) so that the value of the load current $i_{T1}'$ sufficient to cause the current $i_{T3}$ to flow will be smaller without the N-emitter layer $N_E$ than with it. In the device shown in FIGS. 5 to 7 wherein such an N-emitter layer $N_E$ as mentioned above is not provided, the load current $i_{T3}$ can begins to flow earlier so that the temperature rise due to joule heat at the part of P-N-P-N junction where the load current $i_{T1}$ flows initially, can be suppressed. This will add to the above said tolerable limit level.

The second effect is that the tolerance to noise is high. Namely, in the device shown in FIGS. 5, 6 and 7, the diode $D_2$ is reverse-biased by the application of a gate voltage, as seen in FIG. 8. Therefore, unless this reverse bias exceeds the breakdown voltage determined by the distribution of impurity density in the N-emitter layer $N_E$ and the P-base layer $P_B$ constituting the diode $D_2$ and by the thicknesses of the respective layers, the gate currents $i_{G1}$ and $i_{G2}$ sufficient to render the device 1 turned on do not flow and hence the load currents $i_{T1}$, $i_{T2}$ and $i_{T3}$ cannot flow. Consequently, according to the device shown in FIGS. 5 to 7, the turn-on of the device 1 due to the noise voltage induced between the gate electrode 5 and the cathode electrode 3 can be prevented since the minimum gate voltage can be increased by setting the breakdown voltage of the diode $D_2$ at a suitable level. Even if the gate voltage is increased, the gate current can be kept small, as previously mentioned, so that the tolerance to the noise voltage can be improved (up to several times that of the conventional device) without increasing the gate power to render the device 1 turned on. Further, the device shown in FIGS. 5 to 7 has the opposing borders of the first and second regions 11 and 12 arranged parallel throughout. However, in order to increase the conduction area of the device, it is necessary to decrease the interval between the first and second regions 11 and 12 with a recess cut in the first region 11 near the gate electrode 5, as designated by an alternate long and two short dash line 7 in FIG. 5. In the device shown in FIGS. 5 to 7, the gate electrode 5 is connected via an N layer 51 with the P-base layer $P_B$, but the gate electrode 5 may be connected directly with the P-base layer $P_B$ if it is not required to improve the limit to the noise.

The specification of one embodiment of the device having such a constitution as shown in FIGS. 5 to 7 is as follows. A thin disc of the gold antimony having a diameter of 25 mm is placed on one of the P-layers of a PNP structure formed of single crystal silicon plate through diffusion technique, and is alloyed to form an N-emitter layer $N_E$. A part of the gold antimony alloy having a diameter of 25 mm is removed by etching to form the cathode electrode 3, a conductive layer 4, and a gate electrode 5, as seen in FIGS. 5 to 7. Therefore, the conductive layer 4 and the gate electrode 5 are both kept in ohmic contact with the N-emitter layer $N_E$. The part of the N-emitter layer $N_E$ where the gold antimony alloy is removed is further etched away to expose a part of the P-base layer between the cathode electrode 3 and the second region 12. The device having such a structure as described above has an advantage that it can be fabricated by merely etching away a part of the cathode electrode and a part of the N-emitter layer of a conventional alloy thyristor. As a result of measuring the thus fabricated test device when it is turned on by a gate voltage having a pulse duration of 2 $\mu$sec (with a rise time of 0.5 $\mu$sec), it has been observed that the minimum gate voltage and the corresponding gate current for a junction temperature of 115°C are 11 volts and 22 milliamperes, respectively. On the other hand, with the conventional device in which a gate electrode is provided on the surface of the P-base layer to apply a gate voltage between the gate electrode and the cathode, the measurement under the same condition as on the above-mentioned test device has revealed that the gate voltage and the gate current are 1.2 V and 100 mA, respectively. As is apparent from the results of the above measurements, the device shown in FIGS. 5 to 7 has a gate voltage 10 times higher than that of the conventional device but has a gate current which is equal in amplitude to one fifth of that of the conventional device, the gate power being only 0.2 watt and not proportional to the gate voltage. Therefore, the present device is not turned on by a noise voltage having a peak value of less than 11 volts and pulse width of 2 $\mu$sec so that the limit to the noise voltage can be shifted up ten times as high while the gate power is kept small. As a result of a test in which the inrush current slope di/dt is increased up to a level at which the tested device breaks down and in which current conduction is by means of a single pulse, it has been revealed that the tolerable limit to that di/dt for the conventional device having such a structure as described above equals 1800 A/$\mu$S while that limit for the device shown in FIGS. 5 to 7 is 6000 A/$\mu$S. Thus, the tolerance to the inrush current slope di/dt of the present device is about three times as large as that of the conventional device.

FIGS. 9 and 10 show a second embodiment of the semiconductor controlled rectifying device according to the present invention. In this embodiment the second region 12 of the N-emitter layer $N_E$ is formed in the shape of a ring enclosing the first region 11 therein so as to enlarge the initial turn-on area in the first region 11 and therefore to further shift up the tolerance limit to the inrush current slope di/dt in comparison with the devices described above.

Namely, by forming the second region 12 of the N-emitter layer $N_E$ in the form of a ring enclosing the first region therein, the load current $i_{T1}$ which flows initially through a part of the second region 12 when the part is turned on by the gate current, spreads over the entire body of the ring-shaped conductive layer 4 and flows into the first region 11 across its entire periphery so that the part of the first region 11 throughout along the length of the periphery is turned on. Thus, in this case the conducting area in the first region at the beginning of the secondary turn-on can be considerably increased and the inrush current slope di/dt rating can also be increased, in comparison with the devices described above. In this case also, it is necessary to make the resistance between the first and second regions 11 and 12 uniform throughout along the periphery of the first region 11 or along the periphery of the first region 11 except near the gate electrode 5. Moreover, as has been described above, it is necessary to dispose the gate electrode 5 in such a position that the part of the second region 12 near the gate electrode 5 is turned on simultaneous with or earlier than the part of the first region 11 near the gate electrode 5. In the device shown in FIGS. 9 and 10, the gate electrode 5 is kept in non-ohmic contact with the P-base layer $P_B$ and the first and second regions 11 and 12 are disposed parallel to each other. However, the gate electrode 5 may be kept in ohmic contact with the P-base layer and as in the device shown in FIGS. 1 and 2, the third region 13 may be formed to keep the gate electrode 5 in ohmic contact therewith, or the interval between the first and second regions 11 and 12 may be decreased with a recess cut in the first region 11 near the gate electrode 5, as seen designated by alternate long and two short dash line 7 in FIG. 9.

FIGS. 11 and 12 show a third embodiment of the semiconductor controlled rectifying device according to the invention. This device has the first region 11 of the N-emitter layer $N_E$ formed in the shape of a ring enclosing the second region 12 of the N-emitter layer $N_E$, and the area of the first region 11 of this device is made larger than that of the device shown in FIGS. 9 and 10 so that the conduction capacity for the load current is accordingly increased.

Namely, the second region 12 is formed in the shape of a disc and the first region 11 is formed apart by a constant distance from the periphery of the second region 12. With this structure the area of the second region 12 is smaller and the area of the first region 11 is larger in comparison with the structure shown in FIGS. 9 and 10. Therefore, the load current conduction capacity of this device becomes larger than that of the device shown in FIGS. 9 and 10. This device shown in FIGS. 11 and 12 has a mean peripheral length slightly smaller in comparison with the device shown in FIGS. 9 and 10, the mean peripheral length being defined as the mean between the distances along the boundaries of the first and second regions 11 and 12 opposite to each other. Therefore, the conduction area in the first region 11 at the early stage of the turn-on in this device is smaller than that in the device shown in FIGS. 9 and 10 but larger than those of the devices shown in FIGS. 1 and 2 and in FIGS. 5, 6 and 7. Namely, in the devices shown in FIGS. 1 and 2 and in FIGS. 5, 6 and 7 the first and the second regions 11 and 12 are opposed to each other at one end of the N-emitter layer $N_E$ and it takes some time for the conduction area to spread all over the first region 11 after the part of the first region 11 opposite to the second region 12 has been turned on. On the other hand, in the device shown in FIGS. 11 and 12, the periphery of the second region 12 and the opposing inner boundary of the first region 11 are concentric so that the spreading of the conducting area all over the first region 11 can be faster. Also, in this case, the resistance between the first and second regions 11 and 12 must be made uniform throughout along the periphery of the second region 12 or along the part of the periphery except that near the gate electrode 5, as designated by alternate long and two short dash line 7 in FIG. 11. Moreover, the gate electrode 5 should also be disposed in such a position that the part of the sec-
ond region 12 near the gate electrode 5 may be turned on due to the gate current simultaneous with or earlier than the part of the first region 11 near the gate electrode 5. In the device shown in FIGS. 11 and 12, the gate electrode 5 is seen as kept in non-ohmic contact with the P-base layer $P_B$. However, the gate electrode 5 may be kept in ohmic contact with the P-base layer $P_B$ or with a third region formed between the first and second regions 11 and 12.

FIGS. 13 and 14 show a fourth embodiment of the present invention, which is different from the device shown in FIGS. 5 to 7 only in that the conductive layer 4 on the second region 12 is extended onto the exposed surface of the P-base layer $P_B$ to enclose the first region 11 with a constant isolating gap provided between the conductive layer 4 and the first region 11. As a result of this modification, the conduction area in the first region 11 at the early stage of the turn-on and the tolerance to the inrush current slope di/dt are both improved in comparison with those of the device shown in FIGS. 5 to 7.

Namely, by extending the conductive layer 4 on the second region 12 onto the surface of the P-base layer $P_B$ so as to enclose the first region 11 with an isolating gap between the first and second regions 11 and 12, the same effect can be obtained as by the device shown in FIGS. 9 and 10. The equivalent circuit of this device shown in FIGS. 13 and 14 corresponds to that shown in FIG. 8 minus the diode $D_4$. Thus, the gate current $i_{G1}$ and the load current $i_{T1}$ easily flow and the load current $i_T$ can be made to flow earlier through the part of the cathode electrode 3 opposite to the conductive layer 4. Consequently, Joule heat generated due to load current $i_{T1}$ through the P-N-P-N junctions can be reduced, and moreover the tolerance to the inrush current slope di/dt of these junctions which are apt to be broken down by the switching power at the early stage of turn-on can be shifted up.

In this case also, it is necessary to make the resistance between the first and second regions 11 and 12 uniform throughout the length of the periphery of the first region 11 or the length of the periphery of the first region 11 except near the gate elctrode 5. Moreover, it is necessary to make the resistance between the extended portion 41 of the conductive layer 4 and the first region 11 uniform throughout the length of the extended portion 41. Furthermore, the gate electrode 5 should be disposed in such a position that the gate current may render at least a portion of the second region turned on. In FIG. 14, the gate electrode 5 is seen as kept in non-ohmic contact with the P-base layer $P_B$. However, it may be kept in ohmic contact with the P-base layer $P_B$ or with a third region formed between the first and second regions 11 and 12.

FIG. 15 shows a semiconductor controlled rectifying device as a fifth embodiment of the present invention. This device is different from the device as shown in FIGS. 5 and 6 in that auxiliary regions 15 are additionally provided each of which region is formed at the location above the N-emitter layer $N_E$ apart from the second region 12 of the N-emitter layer $N_E$ by isolating it from the first region 11 with the P-base layer $P_B$ and topped with conductive layers 8 and that the conductive layers 8 are electrically connected with the second region 12 of the N-emitter layer $N_E$ by means of lead wires 81. With this device, the spreading of the conducting area can be accelerated. Here, too, the resistance between the first region 11 and the second region 12 and the resistance between the first region 11 and the auxiliary regions 15 must be uniform throughout the length of the periphery of the first region 11 or along the periphery of the first region 11 except near the gate electrode 5. Moreover, the gate electrode 5 needs to be so located that the part of the second region 12 near the gate electrode 5 may be turned on simultaneous with or earlier than the part of the first region 11 near the gate electrode 5. In the device shown in FIG. 15, the gate electrode 5 is connected with the P-base layer $P_B$, but it may be connected with a third region formed between the first and second regions 11 and 12, as in the device shown in FIGS. 1 and 2.

The previously described embodiments of the present invention can further be modified with ease into ones described in the following.

FIGS. 16 and 17 show a sixth embodiment of the present invention. This device shown in FIGS. 16 and 17 has the same function as that shown in FIGS. 5 and 6 and can enjoy high tolerance to the inrush current slope di/dt and to the noise voltage. The equivalent circuit of this device can be obtained if in the circuit shown in FIG. 8 one of the terminals of the resistor $r_1$ connected with the junction point of the diodes $D_2$ and $D_2'$ is disconnected and instead connected with the junction point of the diodes $D_3$ and $D_3'$. Therefore, like the device shown in FIGS. 5 and 6, this device can enjoy the high tolerance to the inrush current slope di/dt and to the noise voltage.

FIGS. 18 and 19 show a seventh embodiment of the present invention, which also operates in the same manner as the device shown in FIGS. 5 and 6 and can enjoy high tolerance to the inrush current slope di/dt and to the noise voltage. Since, in this case, the conductive layers 4 and the gate electrode 5 are disposed circumferentially as seen in FIG. 18, a recessed portion in the cathode electrode 3 near the gate electrode 5 need not be provided so that the additional reduction of the area of the cathode electrode 3 can be prevented. If the conductive layers 4 together with the second region 12 were extended along the periphery of the cathode electrode 3 until they would meet each other on the diametrically opposite end, the tolerance to the inrush current slope di/dt could be shifted up. Here again, the gate electrode 5 may be connected with a third region provided between the first and second regions 11 and 12 as in the device shown in FIGS. 1 and 2.

FIGS. 20 and 21 show an eighth embodiment of the present invention. This device is different from that shown in FIGS. 16 and 17 only in that the second region 12 is formed only in the area of the N-emitter layer $N_E$ opposite to the gate electrode 5 and in that the conductive layer 4 on the second region 12 is extended onto the exposed surface of the P-base layer $P_B$ so as to enclose the first region 11 therein with a gap having a constant width left between the layer 4 and the first region 11. The conductive layer 4 and its extended portion 41 form a ring, as seen in FIG. 20, but they need not necessarily form a ring-shaped structure.

While there has been illustrated and described what is at present considered to be preferred embodiments of the present invention, it will be appreciated that other changes and modifications are likely to occur to those skilled in the art and that the present invention will by no means be limited to those embodiments above.

What is claimed as new and desired to be secured by Letters Patent is:

1. A semiconductor controlled rectifying device comprising:
    a semiconductor substrate having a four-layer structure consisting of alternate P- and N-type layers, one of the outermost layers having a first region and a second region which has a smaller area than said first region and which is separated from said first region by a predetermined distance;
    a first main electrode kept in ohmic contact with said first region;
    a second main electrode kept in ohmic contact with the other of said outermost layers;
    a conductive layer kept in contact with said second region, which is electrically isolated from said first main electrode; and
    trigger means provided between said first and second regions,
    wherein a portion of said intermediate layer is exposed between said first and second regions so that respective side surface portions of said first and second regions face one another and the distance therebetween defines the width of the exposed portion of said intermediate layer, and wherein said trigger means has a gate electrode coupled to the exposed portion of said intermediate layer, with the width of the exposed portion of the intermediate layer at the portions thereof other than where said gate electrode is coupled thereto being uniform, and the height of said respective side surface portions of said first and second regions being uniform, whereby the parts of the four layers which are closest to the trigger means and have said first region and said second region as an outermost layer, respectively, are simultaneously turned on by a trigger signal supplied from the trigger means and then at least remaining parts of the four layers, which have said first region as an outermost layer and are spaced apart from the four layers which have said second region as an outermost layer, are turned on by means of the load current resulting from the turn-on of the four layers which have said second region as an outermost layer.

2. A semiconductor controlled rectifying device according to claim 1, wherein said gate electrode is coupled to the exposed portion of said intermediate layer through a semiconductor region of a conductivity type corresponding to that of said first and second regions, in non-ohmic rectifying contact with the exposed portion of said intermediate layer.

3. A semiconductor controlled rectifying device according to claim 1, wherein the length along the edges of said first and second regions which directly face one another is greater than the length along the edge of said second region which faces said gate electrode.

4. A semiconductor controlled rectifying device according to claim 1, wherein the density of the gate current flowing from said gate electrode into said first region is equal to that of the gate current flowing from said gate electrode into said second region, in turning-on the portions of the four layers which have said first region as an outermost layer and second region as an outermost layer, respectively.

5. A semiconductor controlled rectifying device according to claim 1, wherein an edge of said second region faces but is spaced apart from an edge of said first region between which said part of said intermediate layer is disposed, the spacing between the edges of said first and second regions which directly face one another being constant, while being contoured to surround said part of said intermediate layer and said gate electrode disposed in non-ohmic contact therewith, so that the spacing between the edges of said first and second regions is greater wherein the spacing in contoured than where said first and second regions directly face one another.

6. A semiconductor controlled rectifying device comprising:
a semiconductor substrate having a four-layer structure consisting of alternate P- and N-type layers, one of the outermost layers having a first region and a second region which has a smaller area than said first region and which is separated from said first region by a predetermined distance;
a first main electrode kept in ohmic contact with said first region;
a second main electrode kept in ohmic contact with the other of said outermost layers;
a conductive layer kept in contact with said second region, which is electrically isolated from said first main electrode; and
trigger means provided between said first and second regions, wherein a part of the intermediate layer adjacent to said one outermost layer is exposed between said first and second regions so that said trigger means has a gate electrode kept in non-ohmic contact with the exposed surface of said part, said trigger means including means for applying a gate voltage between said first main electrode and said gate electrode, and
wherein the impedance from said gate electrode directly toward said first region is at least equal to the impedance from said gate electrode through said second region directly toward said first region,
whereby the parts of the four layers, which are closest to the trigger means an have said first region and said second region as an outermost layer, respectively, are simultaneously turned on by a trigger signal supplied from the trigger means and then at least remaining parts of the four layers, which have said first region as an outermost layer and are spaced apart from the four layers which have said second region as an outermost layer, are turned on by means of the load current resulting from the turn-on of the four layers which have said second region as an outermost layer, wherein the density of the gate current flowing from said gate electrode into said first region is approximately equal to that of the gate flowing from said gate electrode into said second region.

7. A semiconductor controlled rectifying device comprising:
a semiconductor substrate having a four-layer structure consisting of alternate P- and N-type layers, one of the outermost layers having a first region and a second region which has a smaller area that said first region and which is separated from said first region by a predetermined distance;
a first main electrode kept in ohmic contact with said first region;
a second main electrode kept in ohmic contact with the other of said outermost layers;
a conductive layer kept in contact with said second region, which is electrically isolated from said first main electrode; and trigger means provided between said first and second regions, wherein a part of the intermediate layer adjacent to said one outermost layer is exposed between said first and second regions so that said trigger means has a gate electrode kept in non-ohmic contact with the exposed surface of said part, said trigger means including means for applying a gate voltage between said first main electrode and said gate electrode, and
wherein the impedance from said gate electrode directly toward said first region is at least equal to the impedance from said gate electrode through said second region directly toward said first region,
whereby the parts of the four layers, which are closest to the trigger means and have said first region and said second region as an outermost layer, respectively, are simultaneously turned on by a trigger signal supplied from the trigger means and then at least remaining parts of the four layers, which have said first region as an outermost layer and are spaced apart from the four layers which have said second region as an outermost layer, are turned on by means of the load current resulting from the turn-on of the four layers which have said second region as an outermost layer, wherein the impedance between said first and second regions is larger at a first area near the gate electrode than at a second area other than said first area.

8. a semiconductor controlled rectifying device comprising:
a semiconductor substrate having first and second principal surfaces on the opposite sides thereof and including
a first layer of semiconductor material of a first conductivity type with one surface thereof forming said first principal surface;
a second layer of semiconductor material of a second conductivity type opposite said first conductivity type forming a first PN junction with said first layer;
a third semiconductor layer of said first conductivity type forming a second PN junction with said second layer;
a fourth semiconductor layer of said second conductivity type forming a third PN junction with said third layer, and having one surface thereof forming said second principal surface, said fourth semiconductor layer being made of a first region and a second region which is spaced apart from said first region by a predetermined distance;
a first main electrode disposed in ohmic contact with said first region of said fourth layer;
a second main electrode disposed in ohmic contact with said first layer at said first principal surface;
means for causing the ignition of said device when respective first and second potentials are applied to said first and second main electrodes to forward bias said first and third PN junctions while reverse-biasing said second PN junction, said means comprising
a third region of semiconductor material of said second conductivity type disposed adjacent to and spaced apart from said first and second regions of said fourth layer while contacting said third layer and forming a PN junction with said third layer,
a gate electrode disposed in ohmic contact with only said third region to which a third potential differing from said first potential is to be applied, and means for applying a gate voltage as said third potential between said first main electrode and said gate electrode; and a conductive layer disposed in ohmic contact with said second region of said fourth layer; and wherein the sum of the impedance over a path between said gate electrode and said second region and the impedance over said predetermined distance between said second region to said first region spaced apart therefrom, which path by-passes said gate electrode and said third region therebeneath, is no greater than the impedance over a path extending from said gate electrode through said third region therebeneath directly to said first region, wherein an edge of said second region faces but is spaced apart from an edge of said first region between which said third region is disposed, the spacing between the edges of said first and second regions which directly faces one another being constant, while being contoured to surround said third region and said gate electrode disposed thereon, so that the spacing between the edges of said first and second regions is greater where the spacing is contoured than where said first and second regions directly face one another.

9. A semiconductor controlled rectifying device comprising:

a semiconductor substrate having a four-layer structure consisting of alternate P- and N-type layers, one of the outermost layers having a first region and a second region which has a smaller area than said first region and which is separated from said first region by a predetermined distance;

a first main electrode kept in ohmic contact with said first region;

a second main electrode kept in ohmic contact with the other of said outermost layers;

a conductive layer kept in contact with said second region, which is electrically isolated from said first main electrode; and trigger means provided between said first and second regions, wherein a part of the intermediate layer adjacent to said one outermost layer is exposed between said first and second regions so that trigger means has a gate electrode kept in non-ohmic contact with the exposed surface of said part, said trigger means including means for applying a gate voltage between said first main electrode and said gate electrode, and wherein the impedance from said gate electrode directly toward said first region is at least equal to the impedance from said gate electrode through said second region directly toward said first region, whereby the parts of the four layers, which are closest to the trigger means and have said first and said second region as an outermost layer, respectively, are simultaneously turned on by a trigger signal supplied from the trigger means and then at least remaining parts of the four layers, which have said first region as an outermost layer and are spaced apart from the four layers which have said second region as an outermost layer, are turned on by means of the load current resulting from the turn-on of the four layers which have said second region as an outermost layer, wherein an edge of said second region faces but is spaced apart from an edge of said first region between which said part of said intermediate layer is deposited, the spacing between the edges of said first and second regions which directly face one another being constant, while being contoured to surround said part of said intermediate layer and said gate electrode disposed in non-ohmic contact therewith, so that the spacing between the edges of said first and second regions is greater wherein the spacing is contoured than where said first and second regions directly face one another.

10. A semiconductor controlled rectifying device according to claim 1, wherein a gate voltage applied between said first main electrode and said gate electrode is more positive at said gate electrode than at said first main electrode.

11. A semiconductor controlled rectifying device according to claim 1, wherein the impedance between said first and second regions is larger at a first area near said gate electrode than at a second area other than said first area.

* * * * *